(12) United States Patent
Shih et al.

(10) Patent No.: US 12,507,402 B2
(45) Date of Patent: Dec. 23, 2025

(54) MEMORY WITH A CONTACT BETWEEN A DATA STORAGE DEVICE AND A DATA PROCESSING DEVICE

(71) Applicant: NANYA TECHNOLOGY CORPORATION, New Taipei (TW)

(72) Inventors: Chiang-Lin Shih, New Taipei (TW); Jhen-Yu Tsai, Kaohsiung (TW); Tseng-Fu Lu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 903 days.

(21) Appl. No.: 17/684,650

(22) Filed: Mar. 2, 2022

(65) Prior Publication Data
US 2023/0284440 A1    Sep. 7, 2023

(51) Int. Cl.
*H10B 12/00* (2023.01)
*H01L 23/00* (2006.01)
(Continued)

(52) U.S. Cl.
CPC ........ *H10B 12/50* (2023.02); *H10B 12/0335* (2023.02); *H10B 12/315* (2023.02); *H10B 12/33* (2023.02); *H10B 12/485* (2023.02); *H10D 30/6734* (2025.01); *H10D 89/811* (2025.01); *H01L 24/14* (2013.01); *H01L 24/16* (2013.01); *H01L 25/0652* (2013.01); *H01L 25/0657* (2013.01); *H01L 2224/14181* (2013.01); *H01L 2224/16146* (2013.01); *H01L 2224/16235* (2013.01); *H01L 2225/06513* (2013.01); *H01L 2225/06517* (2013.01); *H01L 2225/06541* (2013.01); *H01L 2225/06548* (2013.01); *H01L 2924/1436* (2013.01); *H10D 30/6755* (2025.01); *H10D 64/511* (2025.01)

(58) Field of Classification Search
CPC ........ H01L 25/0657; H01L 25/18; G11C 5/02
See application file for complete search history.

(56) References Cited

U.S. PATENT DOCUMENTS 11,114,434 B2   9/2021   Yang et al.
11,855,046 B2   12/2023  Yu et al.
(Continued)

FOREIGN PATENT DOCUMENTS

TW   202115861 A   4/2021
TW   202129913 A   8/2021
(Continued)

OTHER PUBLICATIONS

Young-Cheon Kwon et al, "25.4 A 20nm 6GB Function-In-Memory DRAM Based on HBM2 with a 1.2TFLOPS Programmable Computing Unit Using Bank-Level Parallelism for Machine Learning Applications," ISSCC 2021, Feb. 18, 2021, pp. 349-351.
(Continued)

*Primary Examiner* — Amar Movva
(74) *Attorney, Agent, or Firm* — MUNCY, GEISSLER, OLDS & LOWE, P.C.

(57) ABSTRACT

A memory includes a data storage device, a data processing device, and a contact element. The data processing device is disposed over the data storage device. The contact element is disposed between the data storage device and the data processing device. The contact element electrically connects the data storage device with the data processing device.

17 Claims, 18 Drawing Sheets

(51) Int. Cl.
*H01L 25/065* (2023.01)
*H10D 30/67* (2025.01)
*H10D 64/27* (2025.01)
*H10D 89/60* (2025.01)

(56) References Cited

U.S. PATENT DOCUMENTS

| | | | |
|---|---|---|---|
| 2003/0227042 A1* | 12/2003 | Hibi | H10B 41/40 |
| | | | 257/296 |
| 2016/0307632 A1 | 10/2016 | Lee et al. | |
| 2018/0088155 A1* | 3/2018 | Clarke | H01L 23/62 |
| 2018/0323264 A1 | 11/2018 | Le et al. | |
| 2019/0305137 A1* | 10/2019 | Sharma | H10D 62/292 |
| 2020/0219891 A1 | 7/2020 | Lee et al. | |
| 2020/0328190 A1* | 10/2020 | Liu | H01L 24/94 |
| 2020/0411524 A1 | 12/2020 | Arslan et al. | |
| 2021/0167072 A1 | 6/2021 | Makosiej et al. | |
| 2021/0225809 A1 | 7/2021 | Yu et al. | |
| 2021/0233916 A1 | 7/2021 | Cheng et al. | |
| 2021/0358915 A1 | 11/2021 | Wang | |
| 2021/0407556 A1 | 12/2021 | Matsubara et al. | |

FOREIGN PATENT DOCUMENTS

| | | |
|---|---|---|
| TW | 202209325 A | 3/2022 |
| TW | 202209638 A | 3/2022 |

OTHER PUBLICATIONS

Yuye Kang et al, "Back-End-of-Line_Compatible Fully Depleted CMOS Inverters Employing Ge p-FETs and—InGaZnO n-FETs," IEEE Electron Device Letters, Oct. 2021, vol. 42, No. 10, pp. 1488-1491.

Marko Simicic et al, "ESD study on a-IGZO TFT device_architectures," 2018 40th Electrical Overstress/Electrostatic Discharge Symposium, Sep. 2018, pp. 23-28.

* cited by examiner

MEMORY WITH A CONTACT BETWEEN A DATA STORAGE DEVICE AND A DATA PROCESSING DEVICE

TECHNICAL FIELD

The present disclosure relates to a memory and a method for manufacturing the memory, and more particularly, to a memory having a contact element between a data storage device and a data processing device.

DISCUSSION OF THE BACKGROUND

As computer processing units (CPUs) and graphic processing units (GPUs) or other types of processing units become faster and more powerful, requirements are becoming rigorous with regard to how fast and how much data must be transmitted between these computing units and the memory. Some requirements focus on increasing off-chip bandwidth. However, the power constraint of the ever-shrinking processing units limit the development thereof.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a memory. The memory includes a data storage device, a data processing device, and a contact element. The data processing device is disposed over the data storage device. The contact element is disposed between the data storage device and the data processing device. The contact element electrically connects the data storage device with the data processing device.

Another aspect of the present disclosure provides a method of manufacturing a memory, including: forming a data storage device; forming a data processing device over the data storage device; forming a contact element electrically connected to the data storage device; and forming a data processing device over the data storage device and electrically connected to the contact element.

The memory of the present disclosure includes the data storage device and the data processing device disposed on the data storage device and electrically connected to the data storage device through the contact element. The data processing device may receive or transmit command signals, address signals, or data signals from an external circuit (e.g., a memory controller or a host device) prior to the signals being received by the data storage device. The data storage device may transmit data signals to the data processing device in response to the commands. The data processing device may be configured to process the data signals from the data storage device through, e.g., multiplexing or other functions, and provide higher processing bandwidth between the memory (or the data storage device) and the external device. As such, the bandwidth is increased without sacrificing the low-power performance.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
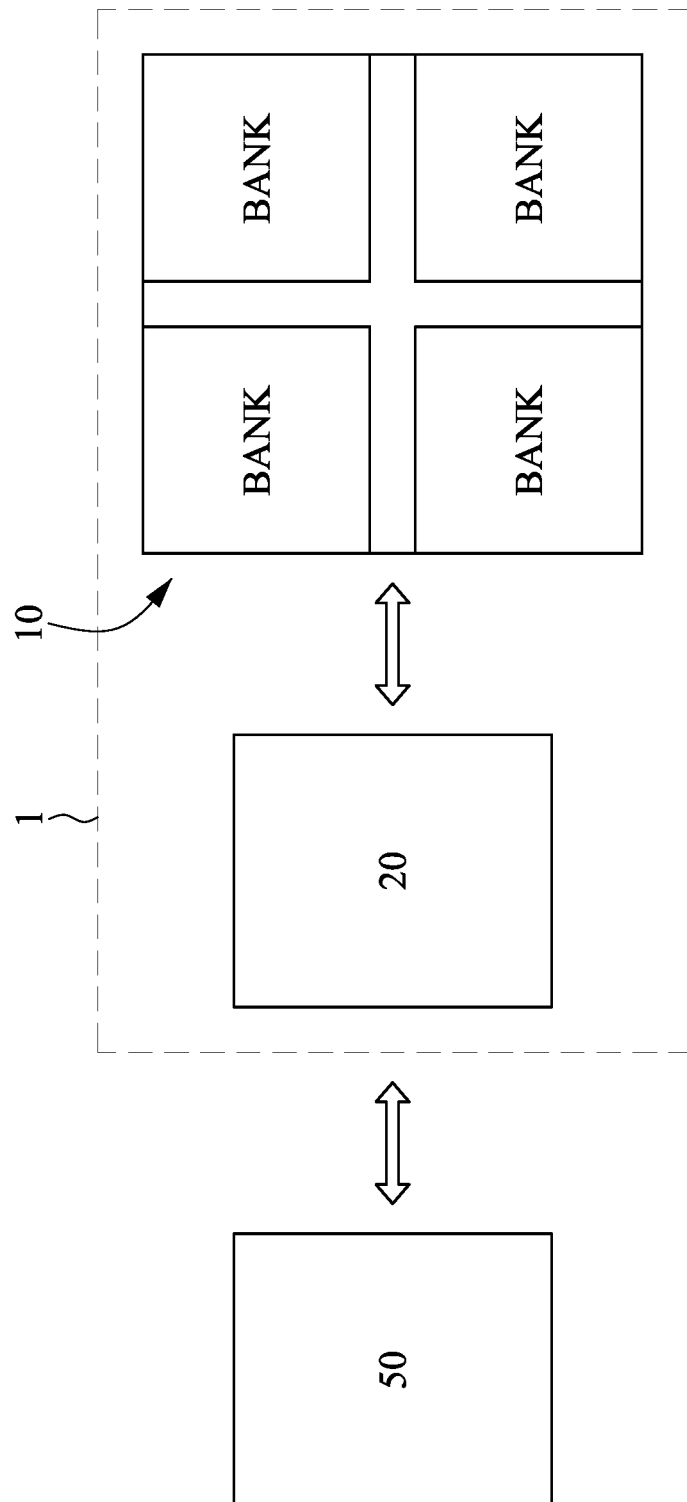
FIG. 1 illustrates a block diagram of a memory and a memory controller in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 illustrates a block diagram of a memory 1 and a memory controller 50 in accordance with some embodiments of the present disclosure. The memory controller 50 may be connected to the memory 1 through a plurality of buses. The memory controller 50 may be configured to control the memory 1. The memory 1 may include a data storage device 10 and a data processing device 20. The memory 1 may be configured to receive address signals, data signals, or command signals to the memory controller 50. The memory 1 may be configured to transmit address signals and data signals to the memory controller 50. The data storage device 10 may be configured to transmit one or more data signals to the data processing device 20. The data storage device 10 may be configured to receive one or more data signals from the data processing device 20.

The data storage device 10 may include a plurality of banks BANK1 to BANK4. Each of the banks may include a plurality of memory cells, a plurality of sense amplifiers (or row buffers), a row decoder, a column decoder, and/or a plurality of input/output (I/O) buffers.

During the read operation, the data processing device 20 may be configured to receive one or more address signals and one or more command signals from the memory controller 50. The data processing device 20 may be configured to process the received signals through, e.g., multiplexing, and then transmit the processed signals to the data storage device 10. The row decoder and the column decoder may receive one or more processed signals (including address signals) and the row decoder and the column decoder may determine the bank addresses corresponding to the address signals. The row decoder may receive one or more processed signals (including command signals) and turn on the word lines according to the bank addresses, and then the data on the same row would be transmitted to the sense amplifiers through bit lines, which in turn determine whether the data are "0" or "1." The determined data signals in the sense amplifiers may then be transmitted to the data processing device 20 after the multiplexing of the address signals in the column decoder. The data processing device may be configured to process the data signals through, i.e., multiplexing, and then transmit the processed data signals to the memory controller 50. The data processing device 20 may increase the bandwidth between the memory controller 50 and the memory 1.

During the write operation, the data processing device 20 may be configured to receive one or more address signals, one or more data signals, and one or more command signals from the memory controller 50. The data processing device 20 may be configured to process the received signals through, e.g., multiplexing, and then transmit the processed signals to the data storage device 10. The row decoder and the column decoder may receive one or more address signals and the row decoder and the column decoder may determine the bank addresses corresponding to the address signals. The row decoder may receive one or more commands and turn on the word lines according to the bank addresses, and then the data signals would be transmitted from the data processing device 20 to the sense amplifiers, which in turn determine whether the data signals are "0" or "1." The determined data signals would then be transmitted to the corresponding data cells through bit lines and stored in the corresponding data cells. The data processing device 20 may increase the bandwidth between the memory controller 50 and the memory 1.

The memory 1 may include a dynamic random access memory (DRAM). The memory controller 50 may include a logic circuit. The memory controller 50 may include a DRAM controller.

Figure 2:
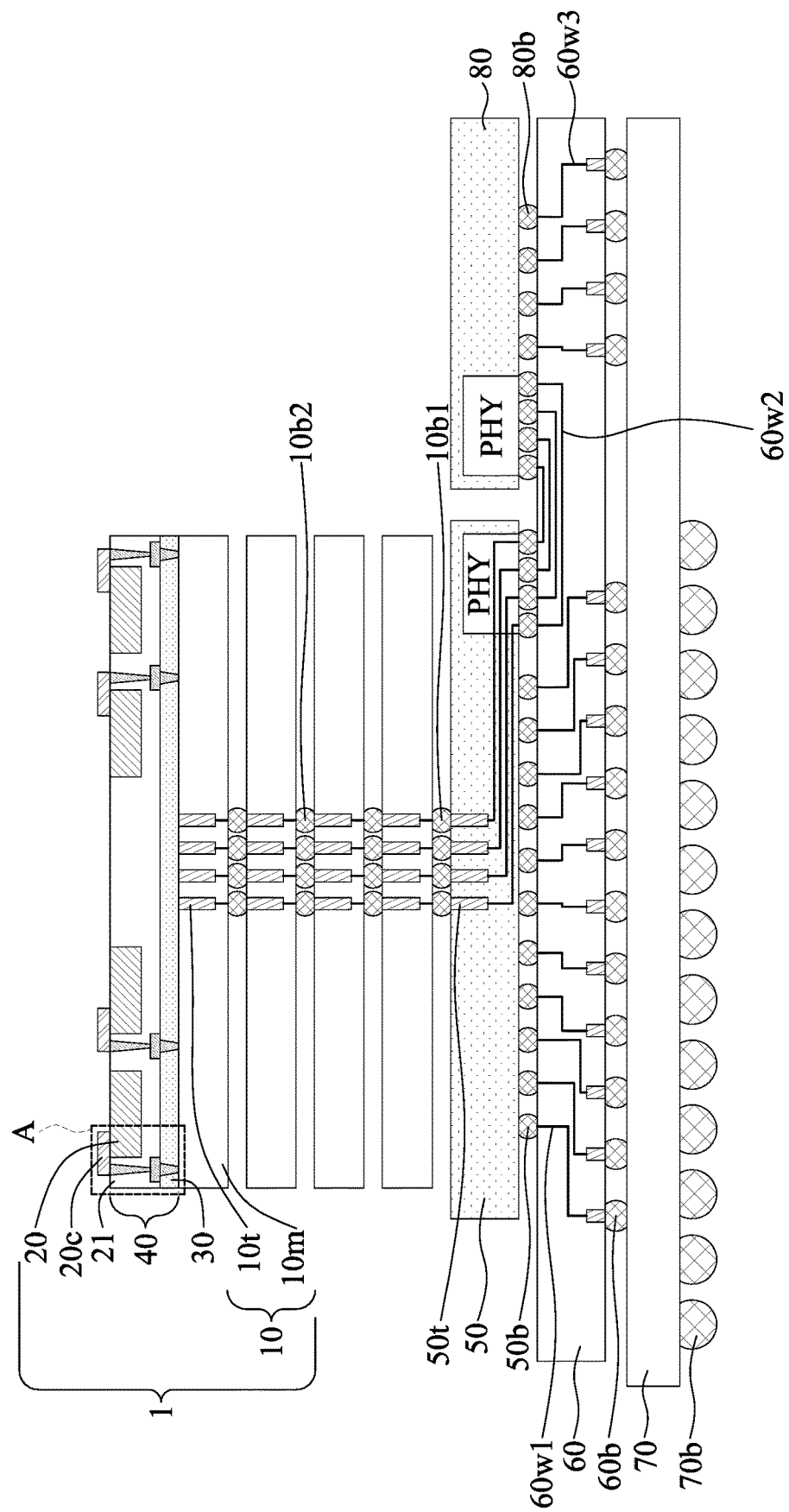
FIG. 2 illustrates a cross-sectional view of a memory integrated in a semiconductor package in accordance with some embodiments of the present disclosure.

FIG. 2 illustrates a cross-sectional view of the memory 1 integrated in a semiconductor package 100 in accordance with some embodiments of the present disclosure. The semiconductor package 100 may include the memory 1, the memory controller 50, an interposer 60, a package substrate 70, and an electronic device 80. The interposer 60 may be disposed on the package substrate 70. The interposer 60 may be mounted on the package substrate 70 through a plurality of connection elements 60b. The memory controller 50 may be disposed on the interposer 60. The memory controller 50 may be mounted on the interposer 60 through a plurality of connection elements 50b. The electronic device 80 may be disposed on the interposer 60. The electronic device 80 may be mounted on the interposer 60 through a plurality of connection elements 60b. The interposer 60 may include a plurality of wiring layers 60w1 electrically connected to the connection elements 60b. The wiring layers 60w2 of the interposer 60 may electrically connect the memory controller 50 (e.g., a physical layer (PHY) thereof)) with the package substrate 70 (e.g., a physical layer (PHY) thereof)). The interposer 60 may include a plurality of wiring layers 60w3 electrically connecting the memory controller 50 with the electronic device 80. The interposer 60 may include a plurality of wiring layers 60w3 electrically connected to the connection elements 60b. The wiring layers 60w3 of the interposer 60 may electrically connect the electronic device 80 with the package substrate 70. The package substrate 70 may include a plurality of connection elements 70b used for mounting to an external supporting substrate or board.

The package substrate 70 may include a printed circuit board. The electronic device 80 may include a processing unit, such as a central processing unit (CPU), graphics processing unit GPU, System on Chip (SOC), or any processing units suitable for artificial intelligence (AI) computing.

The memory controller 50 may include a plurality of through-silicon vias (TSVs) 50t therein and electrically connected to the physical layer PHY of the memory controller 50.

The memory 1 may be disposed on the memory controller 50. The memory 1 may be mounted on the memory controller 50 through a plurality of connection elements 10b1. The memory 1 may include the data storage device 10, the data processing device 20, a connection layer 20c, a capping layer 30, and a contact element 40. The data storage device 10 may include a stack of data storage dies 10m. An upper one of the data storage dies 10m may be mounted on a lower one of the data storage dies 10m through connection elements 10b2. The number of the data storage dies 10m may vary depending on the volume of the data required for the electronic device 80. For example, the number of the data storage dies 10m may be 4 or higher. Each of the data storage dies may include a plurality of TSVs 10t therein. The data storage dies 10m of the data storage device 10 may be electrically connected with the memory controller 50 through the TSVs 10t, connection elements 10b2, and connection elements 10b1.

The capping layer 30 may be disposed between the data storage device 10 and the data processing device 20. The data processing device 20 may be disposed on the capping layer 30. The data processing device 20 may be disposed over the data storage device 10.

The contact element 40 may extend through the capping layer 30. The contact element 40 may be surrounded by the capping layer 30. The contact element 40 may extend through the data processing device (e.g., through a dielectric layer 21 thereof). The contact element 40 may be surrounded by the dielectric layer 21 of the data processing device 20. The connection layer 20c may be disposed on the data processing device 20. The connection layer 20 may electrically connect the contact element 40 with the data processing device 20. The contact element 40 may electrically connect the data storage device 10 with the data processing device 20.

Figure 3:
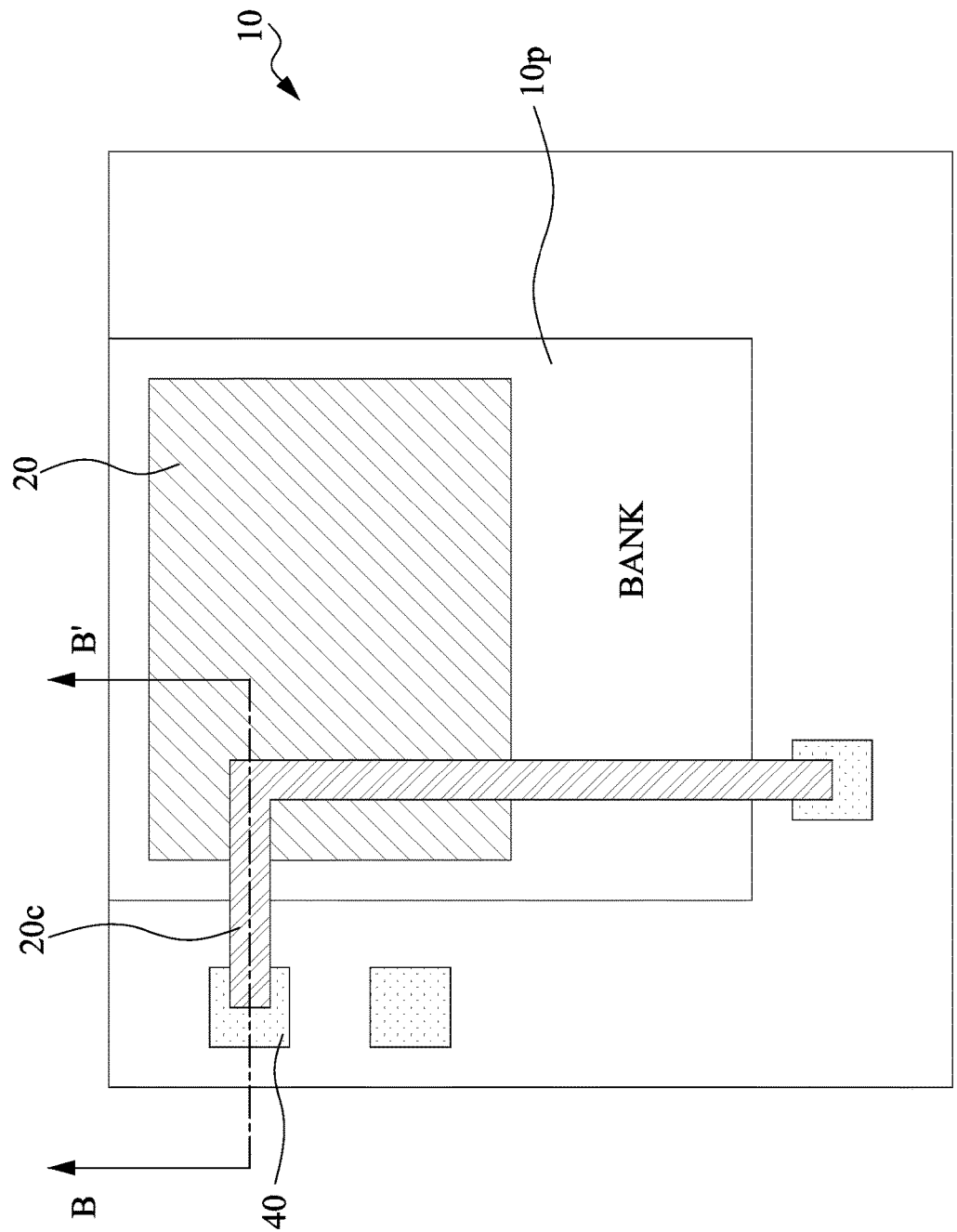
FIG. 3 illustrates a close-up top view of a region enclosed by the box A in FIG. 2 in accordance with some embodiments of the present disclosure.

FIG. 3 illustrates a close-up top view of a region enclosed by the box A in FIG. 2 in accordance with some embodiments of the present disclosure. As shown in FIG. 3, the data processing device 20 may be overlapped with the data storage device 10. The size of the data storage device 10 may be greater than that of the data processing device 20. Alternatively, the size of the data storage device 10 may be smaller than that of the data processing device 20. The data storage device 10 may have a periphery region 10p surrounding the bank of the data storage device 10. The contact element 40 is overlapped with the periphery region 10p of the data storage device 10. The periphery region 10p may include a circuit layer electrically connected with one or more banks of the data storage device 10. The connection layer 20c may include various patterns for connecting the data storage device 10 (or the contact element 40) with the data processing device 20.

Figure 4:
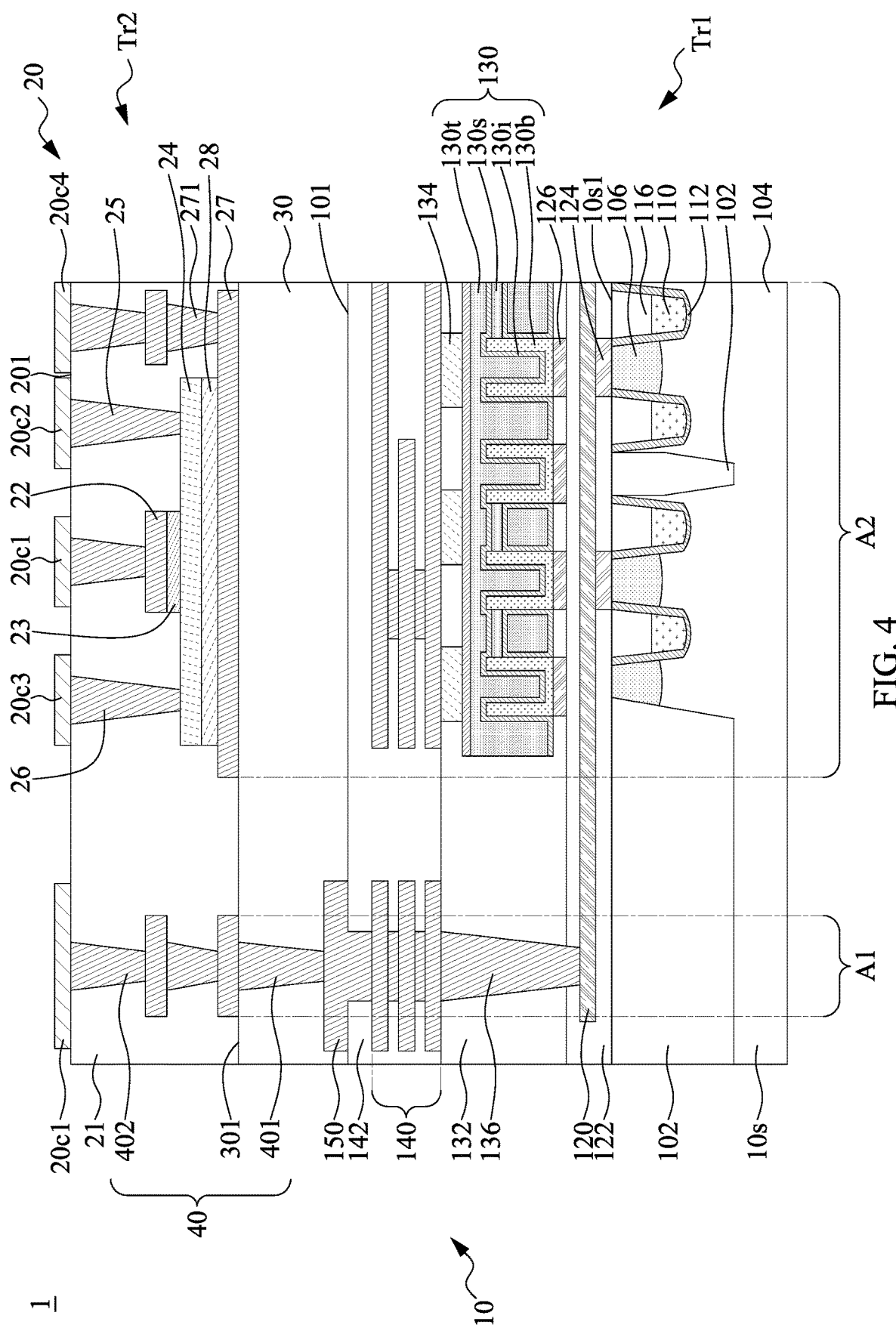
FIG. 4 illustrates a close-up cross-sectional view of a region along the dotted lines B-B' in FIG. 3 in accordance with some embodiments of the present disclosure.

FIG. 4 illustrates a close-up cross-sectional view of a region along the dotted lines B-B' in FIG. 3 in accordance with some embodiments of the present disclosure. The detailed structure of the data storage device 10, the data processing device 20, the capping layer 30, and the contact element 40 are illustrated in FIG. 4.

Referring to FIG. 4, the data storage device 10 may include a cell region including a substrate 10s, a word line 110, a bit line 120, a capacitor 130, a wiring structure 140, and a contact pad 150.

In some embodiments, the substrate 10s may include, for example, silicon (Si), germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials. In some other embodiments, the substrate 10s may include a layered semiconductor such as silicon/silicon germanium, silicon-on-insulator, or silicon germanium-on-insulator.

In some embodiments, one or more isolation structures 102 may be formed in the substrate 10s. The isolation structure 102 may include a shallow trench isolation (STI) structure. In some embodiments, the isolation structure 10a may include an insulating material such as silicon oxide ($SiO_2$), silicon nitride (Si3N4), silicon oxynitride (N2OSi2), silicon nitride oxide (N2OSi2), or fluorine-doped silica. In some embodiments, the isolation structure 102 may define one or more active areas 104 of the substrate 10s.

In some embodiments, one or more doped regions 106 may be formed in an upper portion of the active area 104 of the substrate 10s between two of the isolation structures 102. In some embodiments, the doped region 106 may be doped with an N-type dopant such as phosphorus (P), arsenic (As), or antimony (Sb) for forming an NMOSFET (N-channel metal oxide semiconductor field effect transistor). In some other embodiments, the doped region 106 may be doped with a P-type dopant such as boron (B) or indium (In) for forming a PMOSFET.

In some embodiments, a transistor (e.g., a switching transistor) Tr1 may be formed in the active area 104 of the substrate 10s between two of the isolation structures 102. The doped region 106 may include a source junction or a drain junction of the transistor Tr1.

The word line 110 may be surrounded by the active region 104. A gate dielectric layer 112 may be disposed between the active region 104 and the word line 110. The word line 110 may be surrounded by the gate dielectric layer 112. A buried insulation layer 116 may be disposed on the word line 110. The buried insulation layer 116 may be surrounded by the gate dielectric layer 112. The word line 110 may be used as a gate terminal of the transistor Tr1. The source junction or drain junction in the doped region 106 may extend from the word line 110 to an upper surface 10s1 of the substrate 10s.

The gate dielectric layer 112 may be at least one selected from a silicon oxide layer, a silicon nitride layer, a silicon oxynitride layer, an oxide/nitride/oxide (ONO), or a high-k dielectric film having a greater dielectric constant than a silicon oxide layer. The word line 110 may include at least one material selected from among titanium, tantalum, tungsten, or the combination thereof. The buried insulation layer 124 may at least include a silicon oxide layer, a silicon nitride layer, a silicon oxynitride layer, or a combination thereof.

The bit line 120 may be disposed over the substrate 10s. The bit line 120 may extend along a direction parallel to the surface 10s1 of the substrate 10s. The bit line 120 may be connected to the doped region 106 or the active area 104 of the substrate 10s through conductive contacts 124. The conductive contacts 124 may be disposed between the bit line 120 and the substrate 10s. The bit line 120 may be spaced from the substrate 10s by an insulation layer 122. The conductive contacts 124 may be surrounded by the insulation layer 122. The bit line 120 may be covered by the insulation layer 122. The conductive contacts 124 may be electrically isolated from each other.

In some embodiments, one or more bit lines and one or more word lines (not shown in the figures) may be formed between two adjacent transistors (such as the transistor Tr1). Furthermore, the bit lines and word lines may each be electrically connected to a plug (such as a conductive plug 136 as shown in FIG. 4 which will be discussed later).

The conductive contact 124 may include polysilicon, metal, conductive metal nitride, or a combination thereof. The bit line 120 may include at least one selected from impurity-doped semiconductor, metal, conductive metal nitride, or metal silicide. For example, the bit line 120 may at least include doped polysilicon, TiN, TiSiN, W, tungsten silicide, or a combination thereof. The insulation layer 122 may be an oxide layer, a nitride layer, or a combination thereof.

A plurality of buried contacts 126 may be formed on the insulation layer 122. The plurality of buried contacts 126 may be connected to the active regions 104 of the substrate 10s in a cross-section other than the cross-section of FIG. 4. The plurality of buried contacts 126 may at least include impurity-doped semiconductor, metal, conductive metal nitride, or a combination thereof.

The plurality of capacitors 130 may be connected to the plurality of buried contacts 126. The capacitors 130 may be covered by a dielectric layer 132. The capacitors 130 may be connected to the active region 104 of the substrate 10s. In some embodiments, the capacitors 130 may have a cylindrical shape, while the bottom of the capacitors 130 may be square or circular.

Each of the capacitors 130 may include a bottom electrode 130b, an insulating layer 130i, and a top electrode 130t. For example, a part of the top electrode 130t may be surrounded by the insulating layer 130i, and a part of the top electrode 130t may be surrounded by the bottom electrode 130b. For example, a part of the insulating layer 130i may be surrounded by the bottom electrode 130b. A support element 130s may be disposed between the plurality of capacitors for preventing the capacitors from leaning into each other. The plurality of capacitors 130 may be supported by the support element 130s.

The bottom electrode 130b may be electrically connected to a source junction or a drain junction of a corresponding transistor through the buried contact 126. Thus, each of such bottom electrodes 130b may be applied as a storage node of a storage capacitor for a memory cell. Furthermore, in some embodiments, the top electrode 130t may be a common electrode that may be electrically connected to a ground node within the memory cell. In some embodiments, the top electrode 130t may be electrically connected through other parts of the electrode material of the top electrode 130t or through another conductive element.

In some embodiments, the bottom electrode 130b and the top electrode 130t may include doped polysilicon (poly-Si) or metal. In some embodiments, the insulating layer 130i and the support element 130s may each include tantalum pentoxide ($Ta_2O_5$), aluminum oxide ($Al_2O_3$), strontium bismuth tantalum oxide ($SrBi_2Ta_2O_9$, SBT), barium strontium titanate oxide ($BaSrTiO_3$, BST), a dielectric material having a dielectric constant that is higher than that of silicon dioxide ($SiO_2$), or a dielectric material having a dielectric constant of about 4.0 or greater. In some embodiments, the insulating layer 130i may be formed of a single layer or may be formed of stacked layers.

The capacitors 130 (or the top electrode 130t) may be electrically connected to the wiring structure 140 through a plurality of contact plugs 134. The contact plugs 134 may be surrounded by the dielectric layer 132. The contact plugs 134 may include at least one of metal, conductive metal nitride, a metal-semiconductor compound, and doped polysilicon.

As shown in FIG. 4, a conductive plug 136 may extend through the dielectric layer 132. The conductive plug 136 may be disposed in the dielectric layer 132. The conductive plug 136 may be surrounded by the dielectric layer 132. The conductive plug 136 may electrically connect the bit line 120 with the wiring structure 140. The conductive plug 136 may include at least one of metal, conductive metal nitride, a metal-semiconductor compound, and doped polysilicon.

The wiring structure 140 may be disposed in a dielectric layer 142. The wiring structure 140 may electrically connect the top electrode 130t of the capacitors 130 to a ground node within the memory 10. The wiring structure 140 may electrically connect the bit line 120 to the contact pad 150.

The wiring structure 140 may include a multilayer structure. For example, the wiring structure 140 may include one or more conductive lines and one or more conductive vias for connecting the conductive lines.

The wiring structure 140 may include at least one material selected from metal, conductive metal nitride, a metal-semiconductor compound, and a doped semiconductor. The dielectric layer 142 may include a silicon oxide layer, a silicon nitride layer, a silicon oxynitride layer, or a glass, a polyimide (PI), or a combination thereof.

The contact pad 150 may be disposed on a surface 101 of the data storage device 10. The contact pad 150 may have a portion disposed on the surface 101 of the data storage device 10 and another portion enclosed by the dielectric layer 142. The conductive pad 150 may be electrically connected to an uppermost line of the wiring structure 140. The contact pad 150 may be covered by the capping layer 30. Although a single contact pad 150 is illustrated in FIG. 4, there can be more than one conductive pads disposed on the data storage device 10. In some embodiments, the contact pads may at least include aluminum or a compound thereof.

The capping layer 30 may cover the data storage device 10, such that the data storage device 10 may avoid contamination in the process of forming the data processing device 20. The capping layer 30 may have a thickness sufficient to protect the data storage device 10 from contaminants or particles generated in the formation of the data processing device 20. The thickness of the capping layer 30 may be in a range from about 0.5 μm to about 3 μm.

The capping layer 30 may include a silicon dioxide, glass, sapphire, metal oxide, polyimide, or the like. The capping layer 30 may be referred to as an oxide substrate of the data processing device 20. The capping layer 30 may include, for example, but is not limited to, a multilayer structure. Each layer of the multilayer structure may include different materials, such as silicon dioxide, sapphire, metal oxide, or polyimide. For example, an uppermost layer of the capping layer 30 may include aluminum oxide, an intermediate layer of the capping layer 30 may include polyimide, and a bottommost layer of the capping layer 30 may include glass.

Referring again to FIG. 4, the data processing device 20 may include a dielectric layer 21 and a transistor Tr2 surrounded by the dielectric layer 21. The transistor Tr2 may include a top gate terminal 22, a top gate dielectric layer 23, a channel region 24, a drain terminal 25, a source terminal 26, a bottom gate terminal 27, and a bottom gate dielectric layer 28.

The dielectric layer 21 may be disposed on a surface 301 of the capping layer 30. The bottom gate terminal 27 may be disposed on the surface 301 of the capping layer 30. The bottom gate terminal 27 may be covered by the dielectric layer 21. The bottom gate dielectric layer 28 may be disposed between the channel region 24 and the bottom gate terminal 27. The bottom gate terminal 27 may be disposed between the capping layer 30 and the top gate terminal 22.

The channel region 24 may be disposed over the bottom gate terminal 27. The channel region 24 may be covered by the dielectric layer 21. The channel region 24 may be disposed between the top gate terminal 22 and the bottom gate terminal 27. The channel region 24 may include material of indium gallium zinc oxide (IGZO), indium zinc oxide (IZO), germanium, etc.

The top gate terminal 22 may be disposed over the channel region 24. The top gate dielectric layer 23 may be disposed between the top gate terminal 22 and the channel region 24. The drain terminal may be disposed on the channel region 24. The source terminal 26 may be disposed on the channel region 24. The top gate terminal 22 may be disposed between the drain terminal 25 and the source terminal 26.

The transistor Tr2 may include one of silicon-on-insulator (SOI) transistor, IGZO-based transistor, Ge-based transistor, or N-type CMOS pseudo transistor. Furthermore, the material of the capping layer 30 may vary based on which type of transistor is to be formed.

The transistor Tr2 may be turned on or turned off according to the voltage as applied on the top gate terminal 22. For example, when the voltage as applied on the top gate terminal 22 exceeds a threshold voltage of the transistor Tr2, an accumulation layer would be formed in the channel region 24, and then carriers between the drain terminal and the source terminal 26 can be transferred through the accumulation layer in the channel region 24. In another instance, when the voltage as applied on the top gate terminal 22 is lower than the threshold voltage of the transistor Tr2, no accumulation layer is formed in the channel region 24, such that no carrier is allowed to be transferred through the channel region 24. In some embodiments, the transistor Tr2 may be always-on. For example, an accumulation layer exists in the channel region 24 when the top gate terminal 22 is non-biased. In other words, the top gate terminal 22 may be applied with a voltage that exceeds a turn-off threshold voltage to invert the accumulation layer in the channel region 24.

The bottom gate terminal 27 may be used for tuning the threshold voltage of the transistor Tr2. When the bottom gate terminal 27 is applied with a voltage, it may provide resistance or assistance to the formation of the accumulation layer in the channel region 24. In other words, the bottom gate terminal 27 may partially control the transistor Tr2.

The dual-gate structure (i.e., the top gate terminal 22 and the bottom gate terminal 27) in the transistor Tr2 provides decent threshold voltage control and decent thermal conductivity. As such, the transistor Tr2 may be used as an electrostatic discharge (ESD) protection device or a portion of an ESD protection circuit.

The top gate terminal 22 may have a thickness from about 30 nm to about 300 nm. The top gate dielectric layer may have a thickness from about 5 nm to about 100 nm. The channel region 24 may have a thickness about 100 nm+/−50 nm. The bottom gate terminal 27 may have a thickness from about 30 nm to about 300 nm. The bottom gate dielectric layer 28 may have a thickness from about 5 nm to about 100 nm.

The top gate terminal 22 and bottom gate terminal 27 may each at least include doped polysilicon (poly-Si) or metal. The dielectric layer 21 and the top gate dielectric layer 22 may each at least include silicon dioxide, metal oxide (such as HfLaO or $TiO_2$), or other dielectric materials.

A plurality of connection layers $20c1$, $20c2$, $20c3$, and $20c4$ may be disposed on a surface 201 of the data processing device 20. The connection layer $20c1$ may be electrically connected to the top gate terminal 22. The top gate terminal 22 may be applied with a voltage through the connection layer $20c1$. The connection layer $20c2$ may be electrically connected to the drain terminal 25. The drain terminal 25 may be applied with a voltage through the connection layer $20c2$. The connection layer $20c3$ may be electrically connected to the source terminal 26. The source terminal 26 may be applied with a voltage through the connection layer $20c3$. The connection layer $20c4$ may be electrically connected to the bottom gate terminal 27 through a conductive via 271. The bottom gate terminal 27 may be applied with a voltage through the connection layer $20c4$. In some embodiments, the bottom gate terminal 27 may include the conductive via 271.

The contact element 40 may include a contact plug 401 extending through the capping layer 30. The contact plug 401 may be surrounded by the capping layer 30. The contact plug 401 of the contact element 40 may be disposed between the data processing device 20 and the data storage device 10. The contact element 40 may further include a contact plug 402 extending through the dielectric layer 21. The contact plug 401 and the contact plug 402 may be connected to each other. The contact element 40 may include at least one of metal, conductive metal nitride, a metal-semiconductor compound, and doped polysilicon.

As shown in FIG. 4, the contact element 40 has a first projecting area A1 on the surface 101 of the data storage device 10, and the data processing device 20 has a second projecting area A2 on the surface 101 of the storage structure 10. The first projecting area A1 may be non-overlapped with the second projecting area A2.

The contact element 40 may be electrically connected to the connection layer $20c1$. The transistor Tr2 of the data processing device may be electrically connected to the contact element 40. The contact element 40 may be electrically connected to the contact pad 150. In some embodiments, one of the capacitors 130 of the data storage device may be electrically connected to the contact element 40. The contact element 40 may be electrically connected the bit line 120 of the data storage device 10. The bit line 120 of the data storage device 10 may be electrically connected to the transistor Tr2 of the data processing device 20. In some embodiments, the top gate terminal 22 of the transistor Tr2 of the data processing device 20 may be electrically connected to the bit line 120 of the data storage device 10.

The data processing device 20 may include a programmable computing unit consisting of a plurality of transistors (including the transistor Tr2). Each of the plurality of transistors may have a similar structure to that of the transistor Tr2. The programmable computing unit of the data processing device 20 may have a plurality of functions, for example, but not limited to, multiplexing, adding, multiplying, multiply-accumulating, multiplying-and-adding, storing, moving, copying.

The data processing device 20 may be configured to process data signals, address signals, and command signals prior to the signals being received by the data storage device 10. The data processing device 20 may be configured to process data signals from the data storage device 10 prior to the signals being transmitted to an external device (e.g., the memory controller 50 in FIG. 2). The data processing device 20 may be configured to process data signals based on the instructions from an internal controller therein or from the external device (e.g., the memory controller 50). Since the data processing device 20 is capable of processing the signals with various functions as mentioned above, it may increase the bandwidth between the memory 1 and the external device (e.g., the memory controller 50). Therefore, the demand of the off-chip bandwidth can be reduced.

Furthermore, the process of forming the data processing device is compatible with the back-end-of-line (BEOL) process of the data storage device 10. In other words, the material of the BEOL layers of the data storage device 20 is not inhibited by/is acceptable for the set of equipment regarding formation of the data processing device 20. As mentioned, the data processing device 20 may include transistors with higher mobility, e.g., the IGZO N-type transistors, Ge P-type transistors. As such, it provides an opportunity to optimize the performance and circuit area of the programmable computing unit of the data processing device 20.

The processing temperature of forming the data processing device 20 can be less than about 400° C., which is harmless for the electrical characteristics of the data storage device 10.

In the present disclosure, the memory 1 includes the data storage device 10 and the data processing device 20 disposed on the data storage device 10 and electrically connected to the data storage device 10 through the contact element 40. The conductive path among the data processing device 20 and the data storage device 10 may be relatively short as compared to the circuitry in an external device. Therefore, the latency in the transmission between the memory 1 and an external device can be improved. Furthermore, the size of the memory 1 can be fitted into the package substrate 70. As such, the packaging procedure can remain the same.

FIGS. 5, 6, 7, 8, 9, 10, 11, 12, 13, 14, 15, 16, and 17 illustrate stages of a method of manufacturing a memory in accordance with some embodiments of the present disclosure. At least some of these figures have been simplified for a better understanding of the aspects of the present disclosure. In some embodiments, the memory 1 in FIG. 4 may be manufactured by the operations described below with respect to FIGS. 5, 6, 7, 8, 9, 10, 11, 12, 13, 14, 15, 16, and 17.

Figure 5:
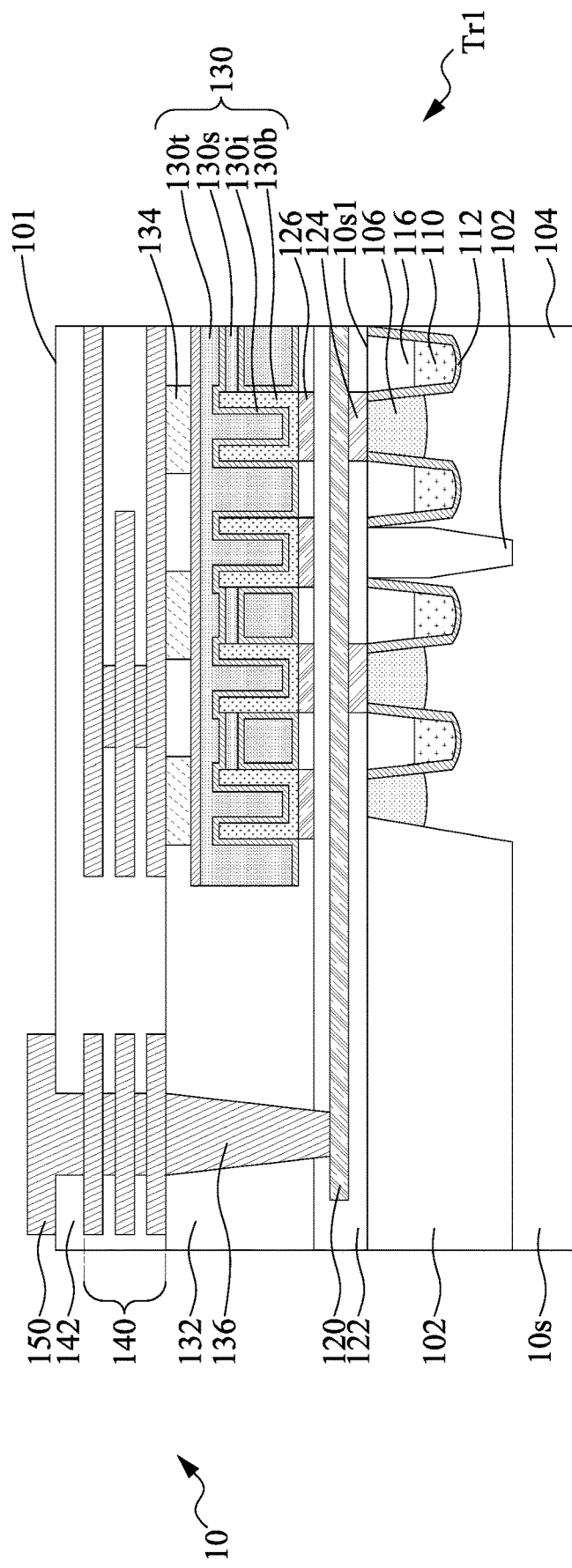
FIG. 5 illustrates one or more stages of a method of manufacturing a memory in accordance with some embodiments of the present disclosure.

Referring to FIG. 5, a storage device 10 may be formed. A substrate 10s, a word line 110, a bit line 120, capacitors 130, a wiring layer 140, and/or a contact pad 150 may be formed. The surface 101 of the data storage device 10 may be exposed. The contact pad 150 may be exposed.

Figure 6:
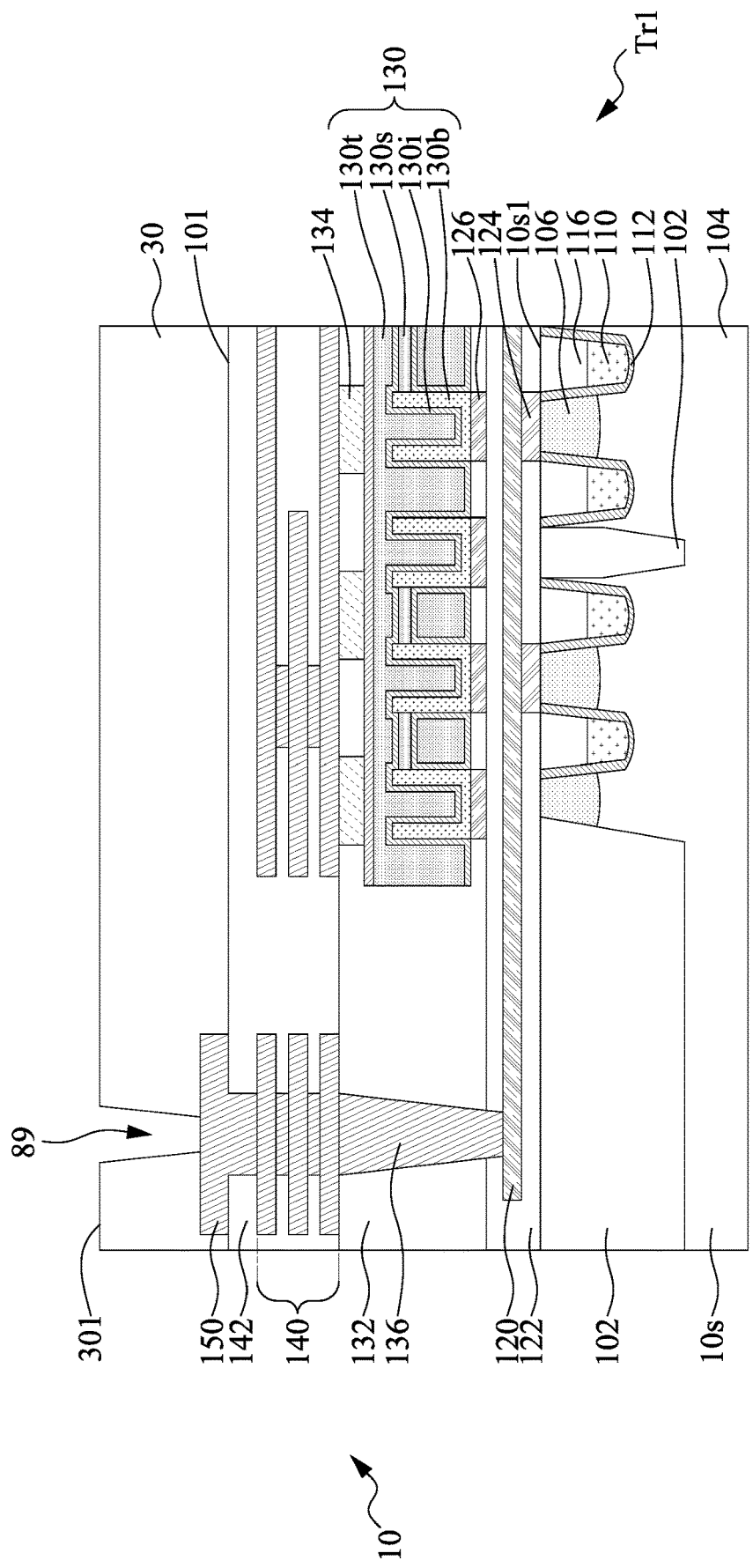
FIG. 6 illustrates one or more stages of a method of manufacturing a memory in accordance with some embodiments of the present disclosure.

Referring to FIG. 6, a capping layer 30 may be formed by, for example, chemical vapor deposition (CVD), physical vapor deposition (PVD), remote plasma CVD (RPCVD), plasma enhanced CVD (PECVD), coating, etc. The capping layer 30 may be patterned and etched to form a contact hole 89. The contact hole 89 may penetrate a portion of the capping layer 30 and expose a portion of the contact pad 150.

Figure 7:
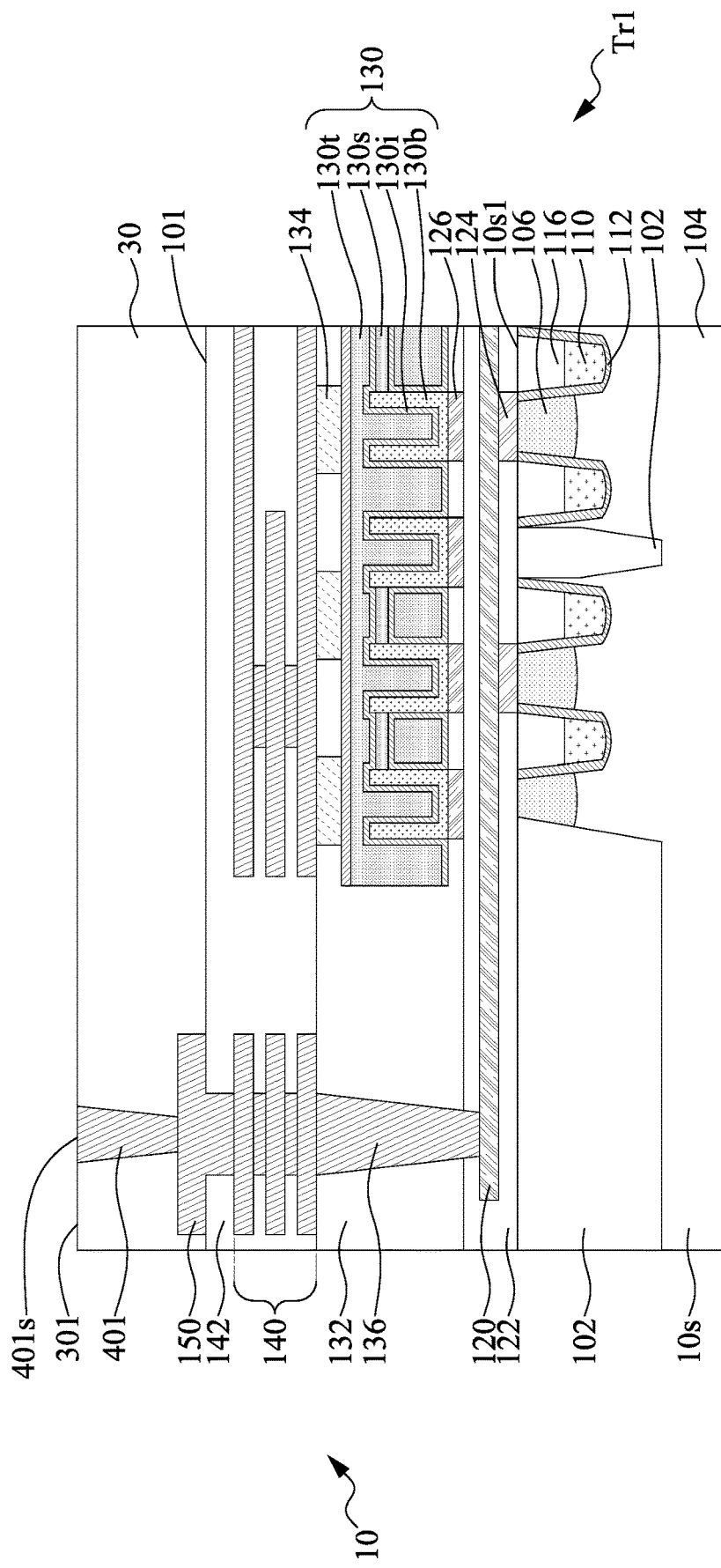
FIG. 7 illustrates one or more stages of a method of manufacturing a memory in accordance with some embodiments of the present disclosure.

Referring to FIG. 7, a conductive material may be formed in the contact hole 89 and the surface 301 of the capping layer 30, followed by chemical mechanical polishing (CMP) to remove the conductive material on the surface 301 of the capping layer 30. As such, a contact plug 401 is formed and a top surface 401s thereof is exposed by the surface 301 of the capping layer 30.

Figure 8:
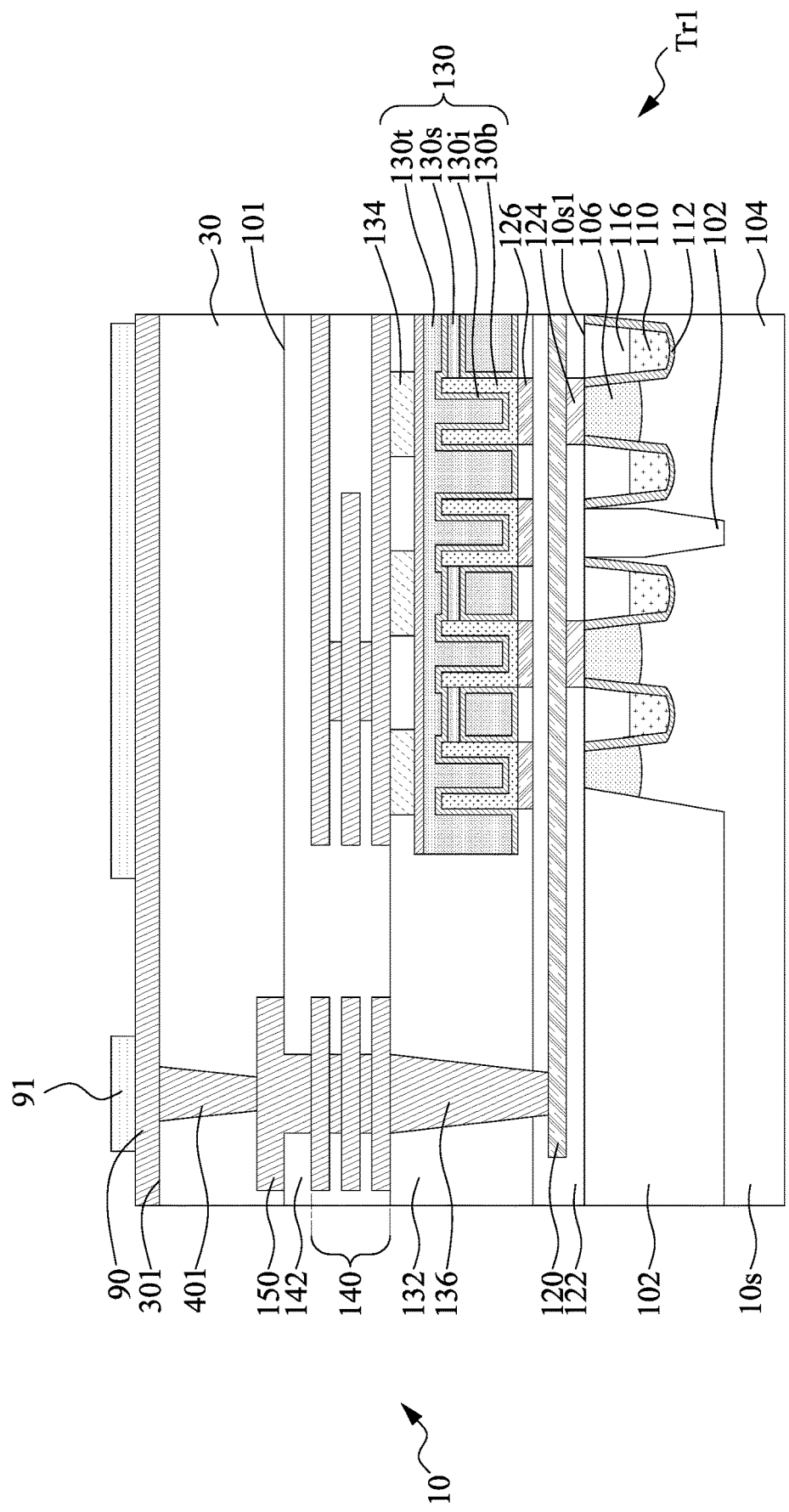
FIG. 8 illustrates one or more stages of a method of manufacturing a memory in accordance with some embodiments of the present disclosure.

Referring to FIG. 8, a conductive material 90 may be formed on the top surface 401s of the contact plug 401 and the surface 301 of the capping layer 30 by, for example, CVD, low pressure chemical vapor deposition (LPCVD), or electroplating. A photoresist layer 91 may be formed on the conductive material 90 and patterned by the lithography process.

Figure 9:
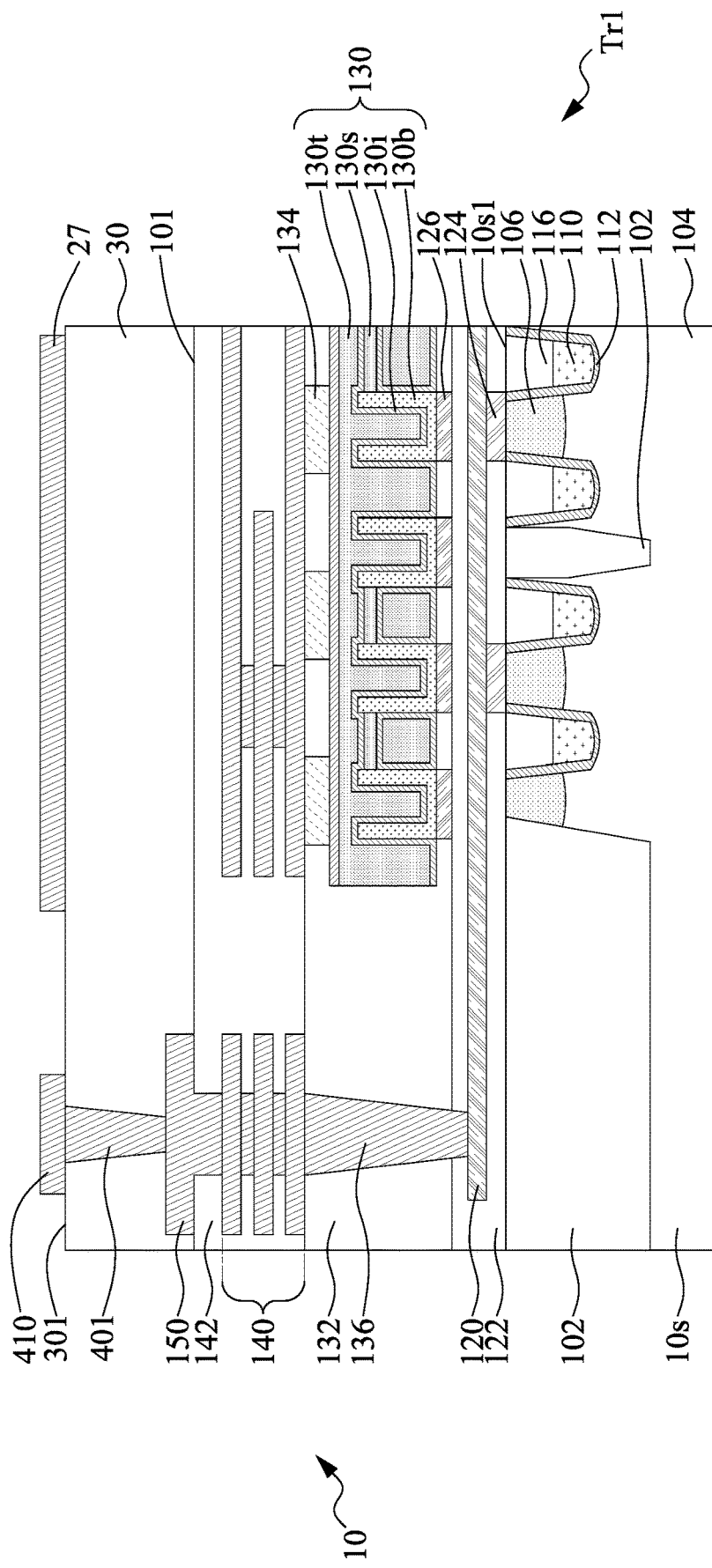
FIG. 9 illustrates one or more stages of a method of manufacturing a memory in accordance with some embodiments of the present disclosure.

Referring to FIG. 9, the conductive material 90 may be etched with the pattern of the photoresist layer 91, and then the remaining part of the photoresist layer 91 may be removed. As such, a bottom gate terminal 27 and a conductive portion 410 are formed on the capping layer 30.

Figure 10:
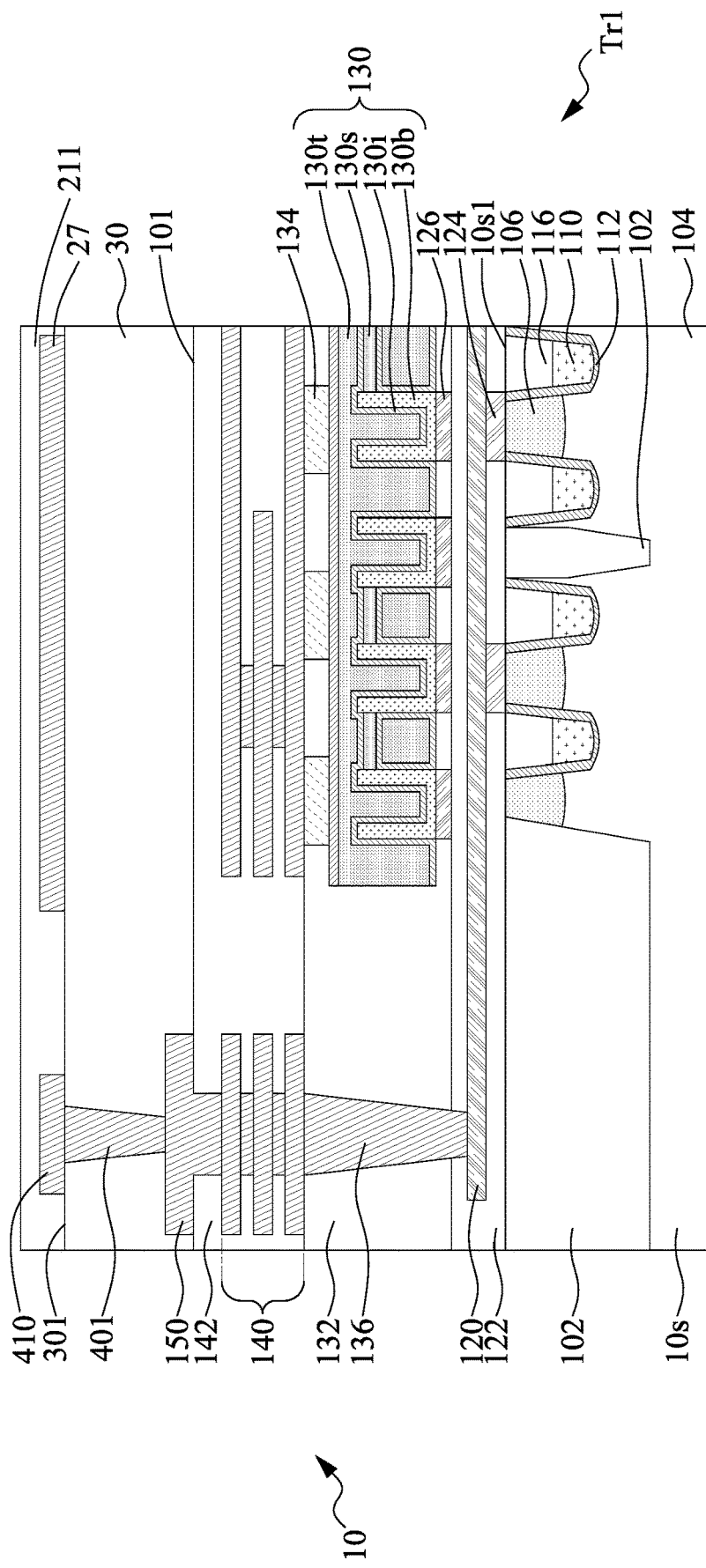
FIG. 10 illustrates one or more stages of a method of manufacturing a memory in accordance with some embodiments of the present disclosure.

Referring to FIG. 10, a dielectric portion 211 may be formed on the surface 301 of the capping layer 30 to cover the conductive portion 410 and the bottom gate terminal 27 by, for example, chemical vapor deposition (CVD), physical vapor deposition (PVD), remote plasma CVD (RPCVD), plasma enhanced CVD (PECVD), coating, etc., followed by a CMP process.

Figure 11:
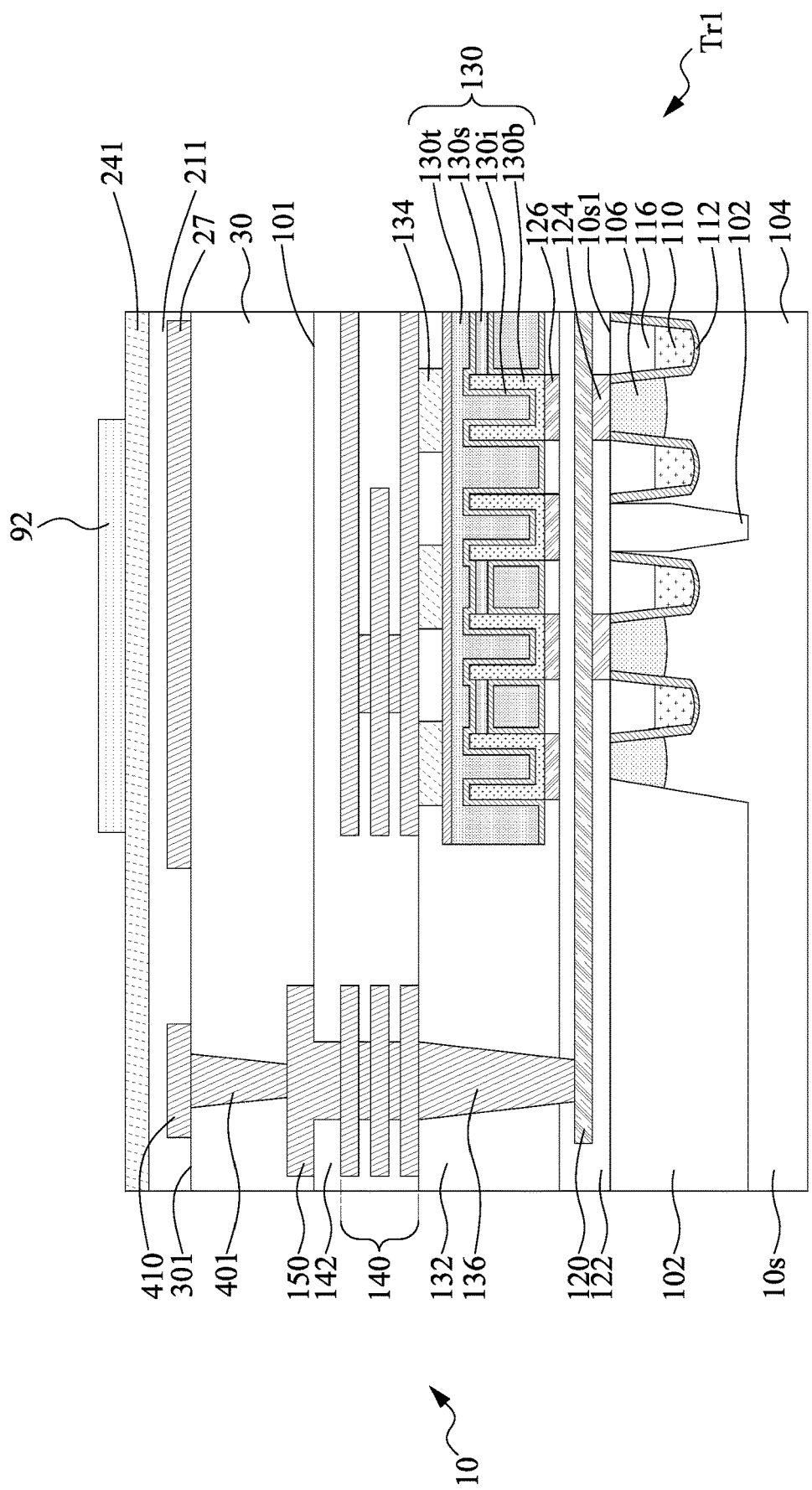
FIG. 11 illustrates one or more stages of a method of manufacturing a memory in accordance with some embodiments of the present disclosure.

Referring to FIG. 11, a channel material 241 may be formed on the dielectric portion 211 by atomic layer deposition (ALD), chemical vapor deposition (CVD), physical vapor deposition (PVD), remote plasma CVD (RPCVD), plasma enhanced CVD (PECVD), coating, etc. The channel material 241 may include indium gallium zinc oxide (IGZO), indium zinc oxide (IZO), germanium, etc.

Furthermore, a photoresist layer 92 may be formed on the channel material 241 and patterned.

Figure 12:
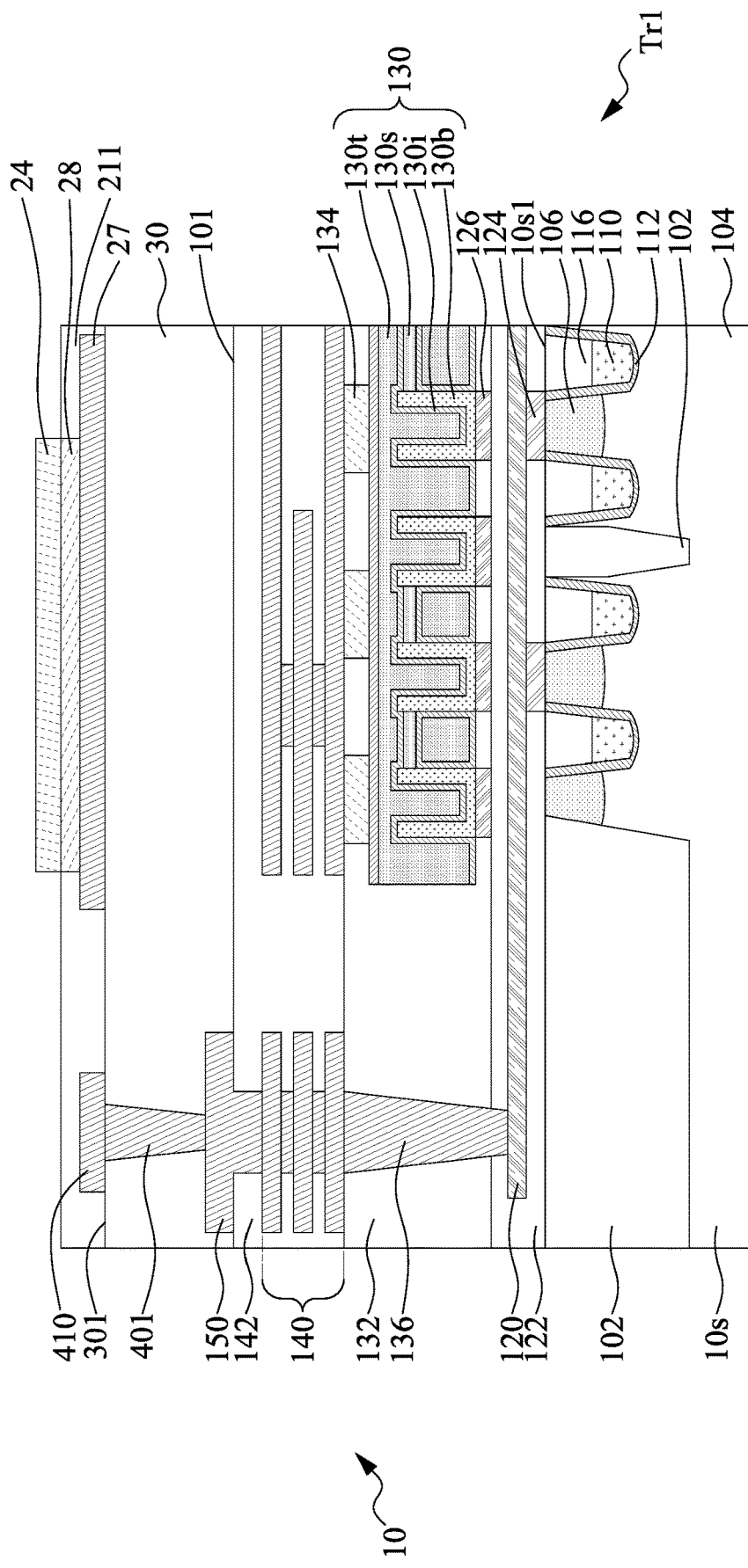
FIG. 12 illustrates one or more stages of a method of manufacturing a memory in accordance with some embodiments of the present disclosure.

Referring to FIG. 12, the channel material 241 may be etched with the pattern defined by the photoresist layer 92, and then a channel region 24 may be formed on the dielectric portion 211 and a bottom gate dielectric layer 28 may be defined between the channel region 24 and the bottom gate terminal 27. The channel region 24 may be over the bottom gate terminal 27.

Figure 13:
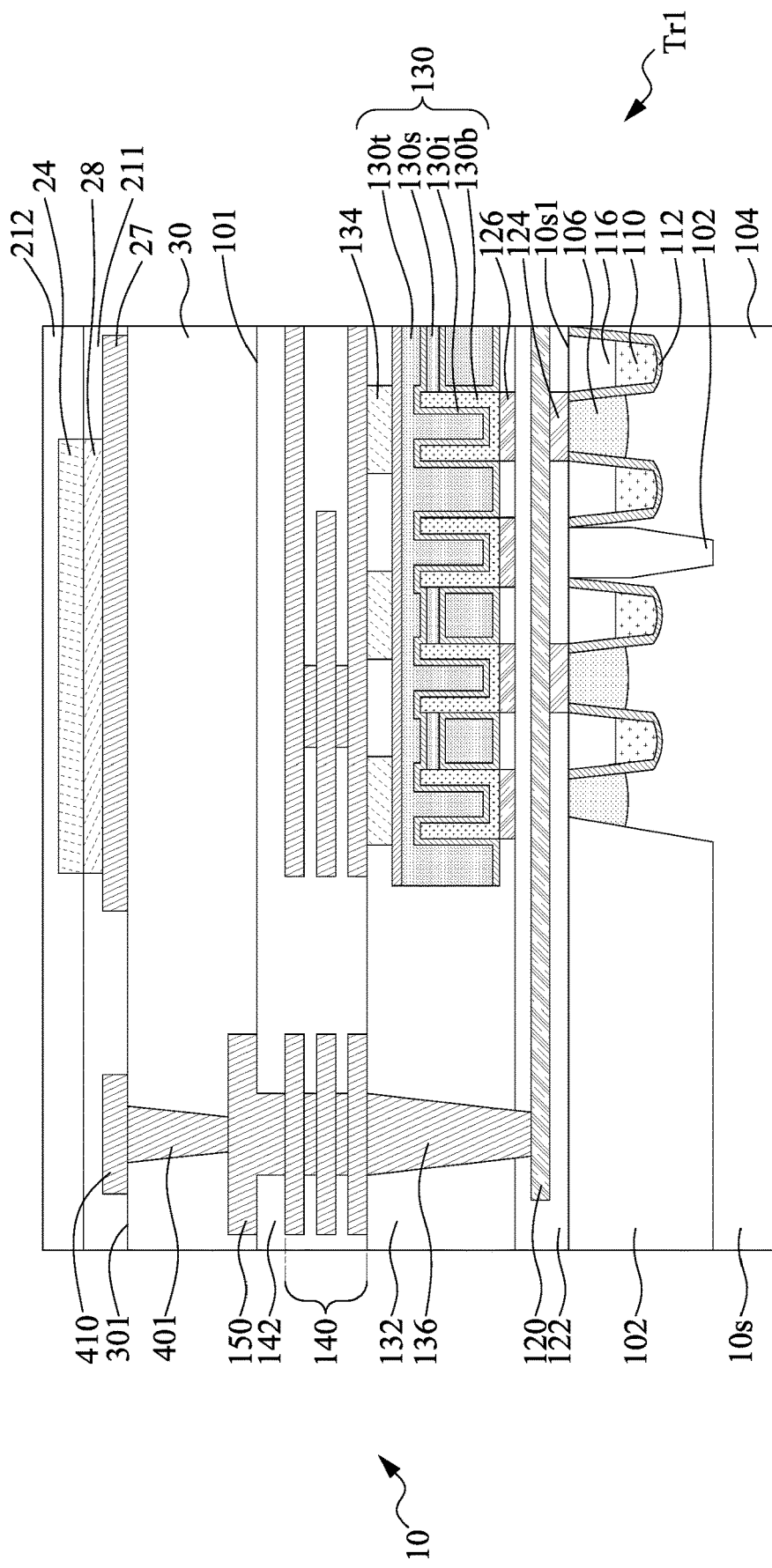
FIG. 13 illustrates one or more stages of a method of manufacturing a memory in accordance with some embodiments of the present disclosure.

Referring to FIG. 13, a dielectric portion 212 may be formed on the dielectric portion 211 to cover the channel region 24 by a process similar to that for the dielectric portion 211.

Figure 14:
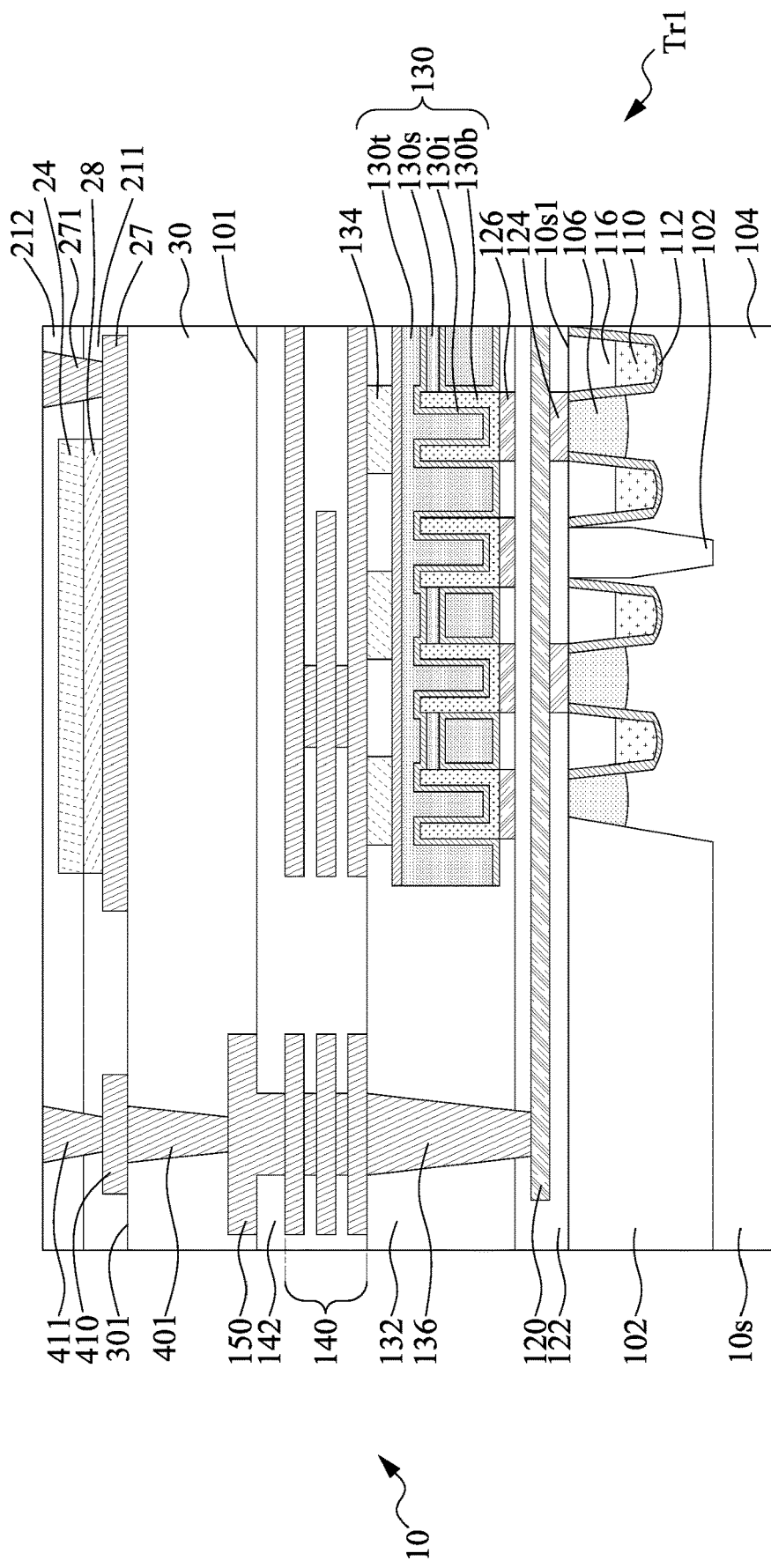
FIG. 14 illustrates one or more stages of a method of manufacturing a memory in accordance with some embodiments of the present disclosure.

Referring to FIG. 14, a conductive via 411 may be formed by, for example, etching, deposition, and CMP processes. The conductive via 411 may be formed on the conductive portion 410 or the bottom gate terminal 27.

Figure 15:
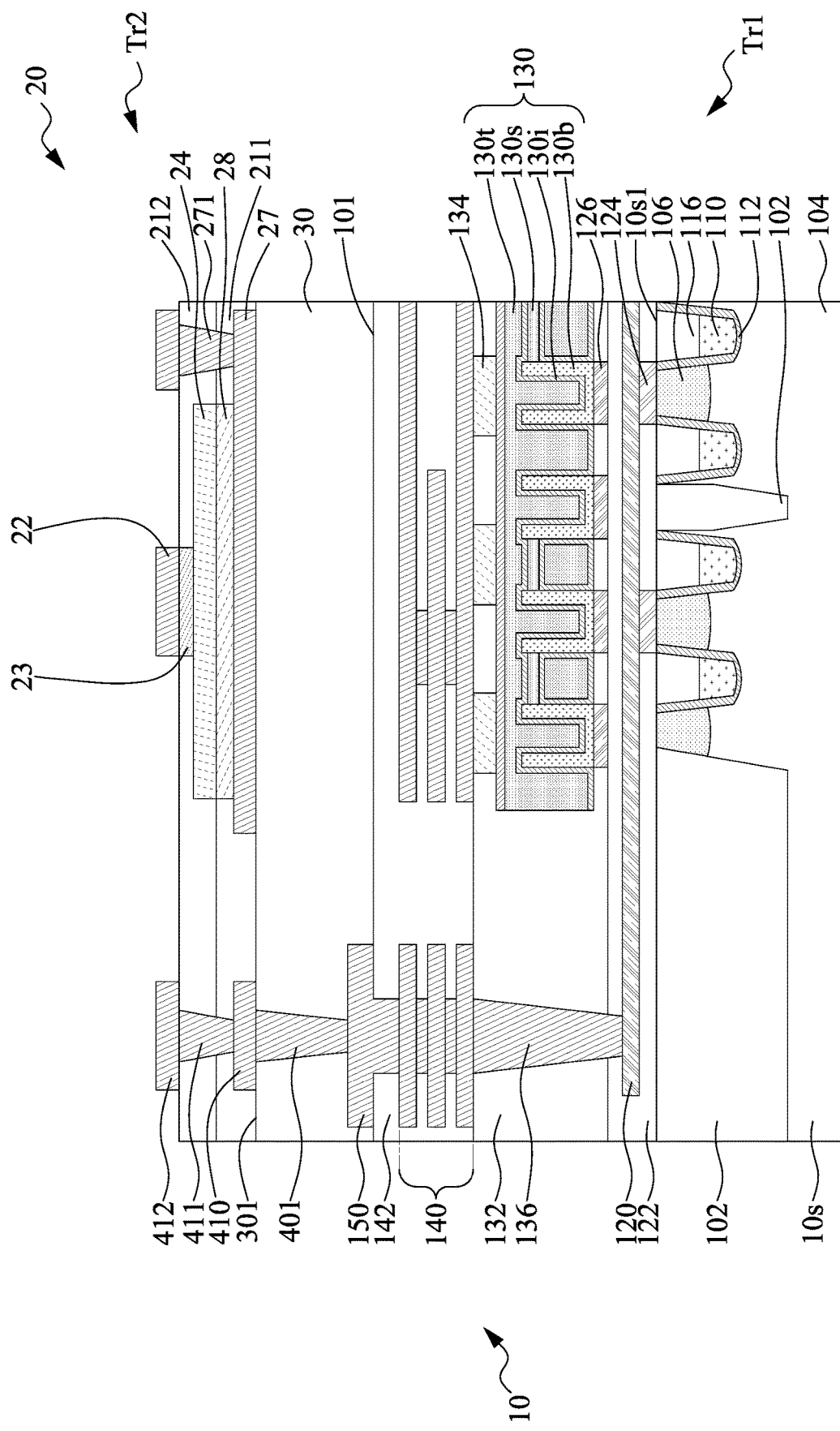
FIG. 15 illustrates one or more stages of a method of manufacturing a memory in accordance with some embodiments of the present disclosure.

Referring to FIG. 15, a conductive portion 412 and a top gate terminal 22 may be formed by a process the similar to that for the conductive portion 410. The top gate terminal 22 may be formed separately when the material of the top gate terminal 22 is different from that of the conductive portion 412. A top gate dielectric layer 23 is defined between the channel region 24 and the top gate terminal 22.

Figure 16:
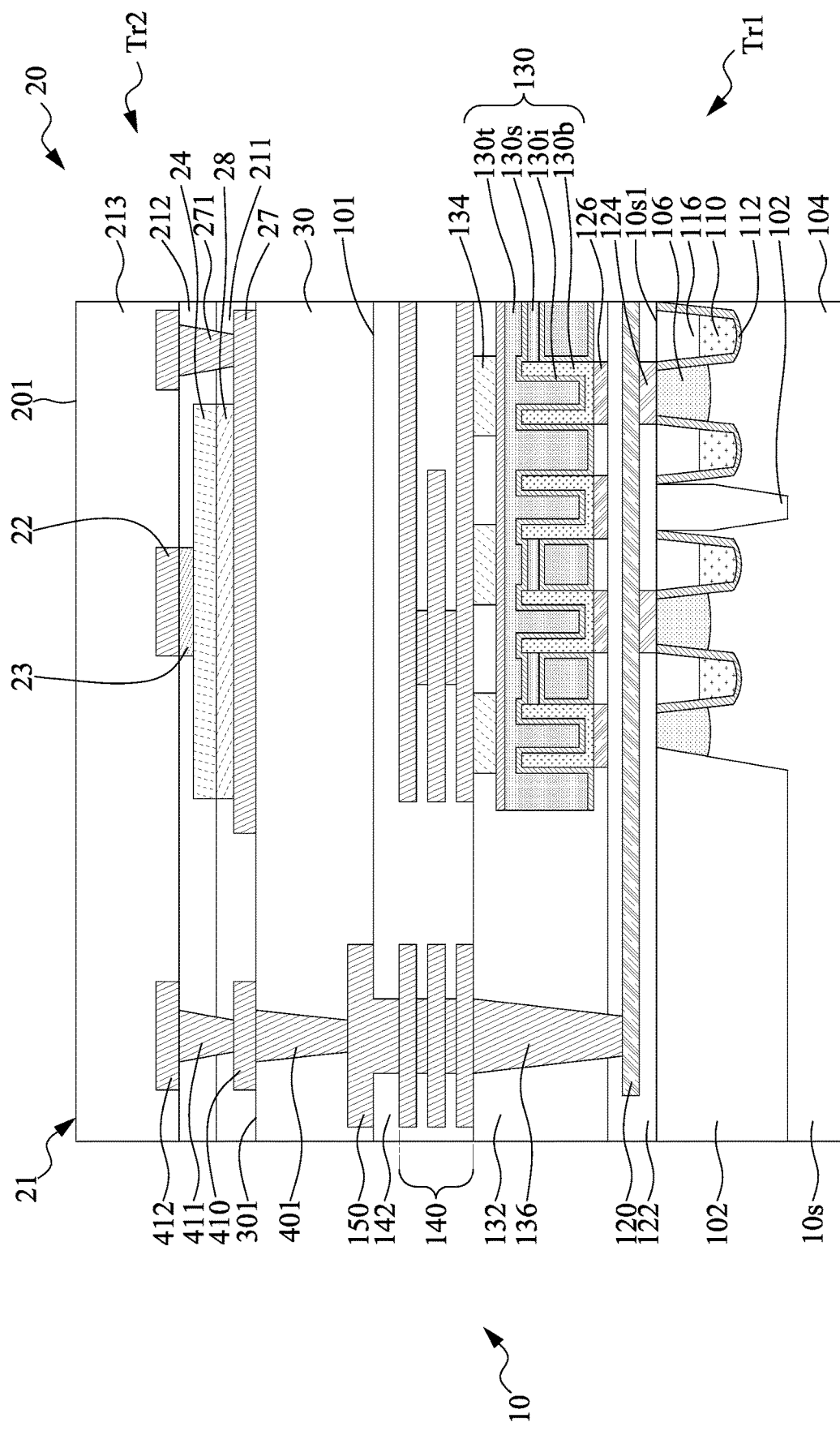
FIG. 16 illustrates one or more stages of a method of manufacturing a memory in accordance with some embodiments of the present disclosure.

Referring to FIG. 16, a dielectric portion 213 may be formed on the dielectric portion 212 to cover the conductive portion 412 and the top gate terminal 22 by a process similar to that for the dielectric portion 211, and thus forming a dielectric layer 21.

Figure 17:
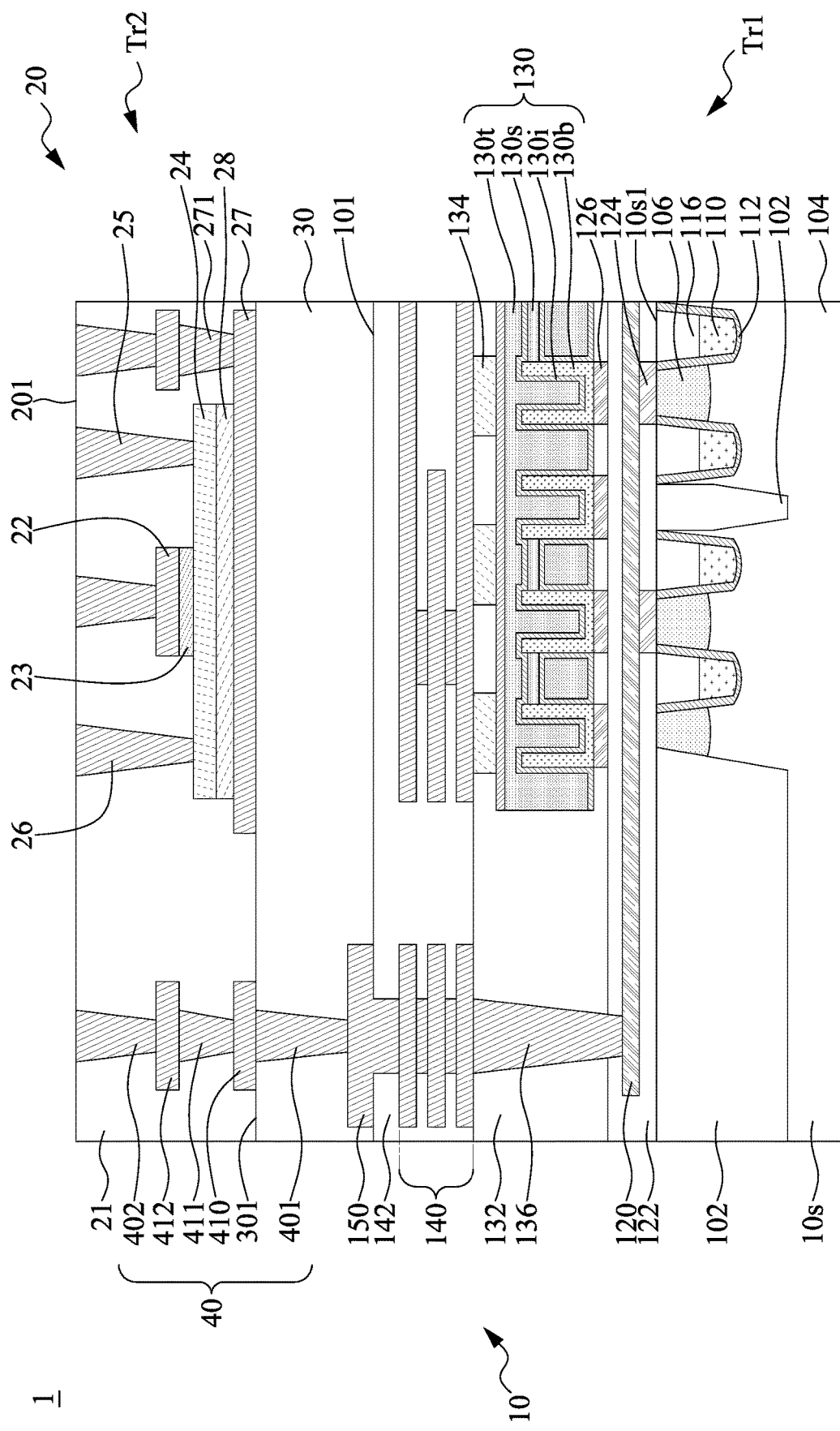
FIG. 17 illustrates one or more stages of a method of manufacturing a memory in accordance with some embodiments of the present disclosure.

Referring to FIG. 17, a conductive via may be formed in the dielectric layer 21 to connect the conductive portion 412. As such, a contact plug 402 is formed in the dielectric layer 21 and connected to the contact plug 401 to form a contact element 40 extending through the dielectric layer 21 and the capping layer 30. The contact element may be electrically connected to the bit line 120 of the data storage device 10. In some embodiments, the contact element 40 may be electrically connected to the capacitor 130 of the data storage device 10. In some embodiments, the contact element 40 may be electrically connected to the word line 110 of the data storage device 10.

Furthermore, a plurality of conductive vias may be formed on the top gate terminal 22, the bottom gate terminal 27, and the channel region 24 to form a transistor Tr2 of a data processing device 20. The transistor Tr2 of the data processing device 20 may be electrically connected to the bit line 120 of the data storage device 10 through the contact element 40. Therefore, a vertical electrical transmission path is formed between the data processing device 20 and the data storage device 10.

Afterwards, a plurality of connection layers (e.g., the connection layers 21c1, 21c2, 21c3, or 21c4 in FIG. 4) may be formed on the surface 201 of the data processing device 20 and connect the contact element 40 with the transistor Tr2 of the data processing device 20 to form the memory 1 of FIG. 4.

Furthermore, the process temperature of the operations in FIGS. 5-17 is less than 400° C. The characteristics of the data storage device is immune from the thermal budget of forming the data processing device 20.

Figure 18:
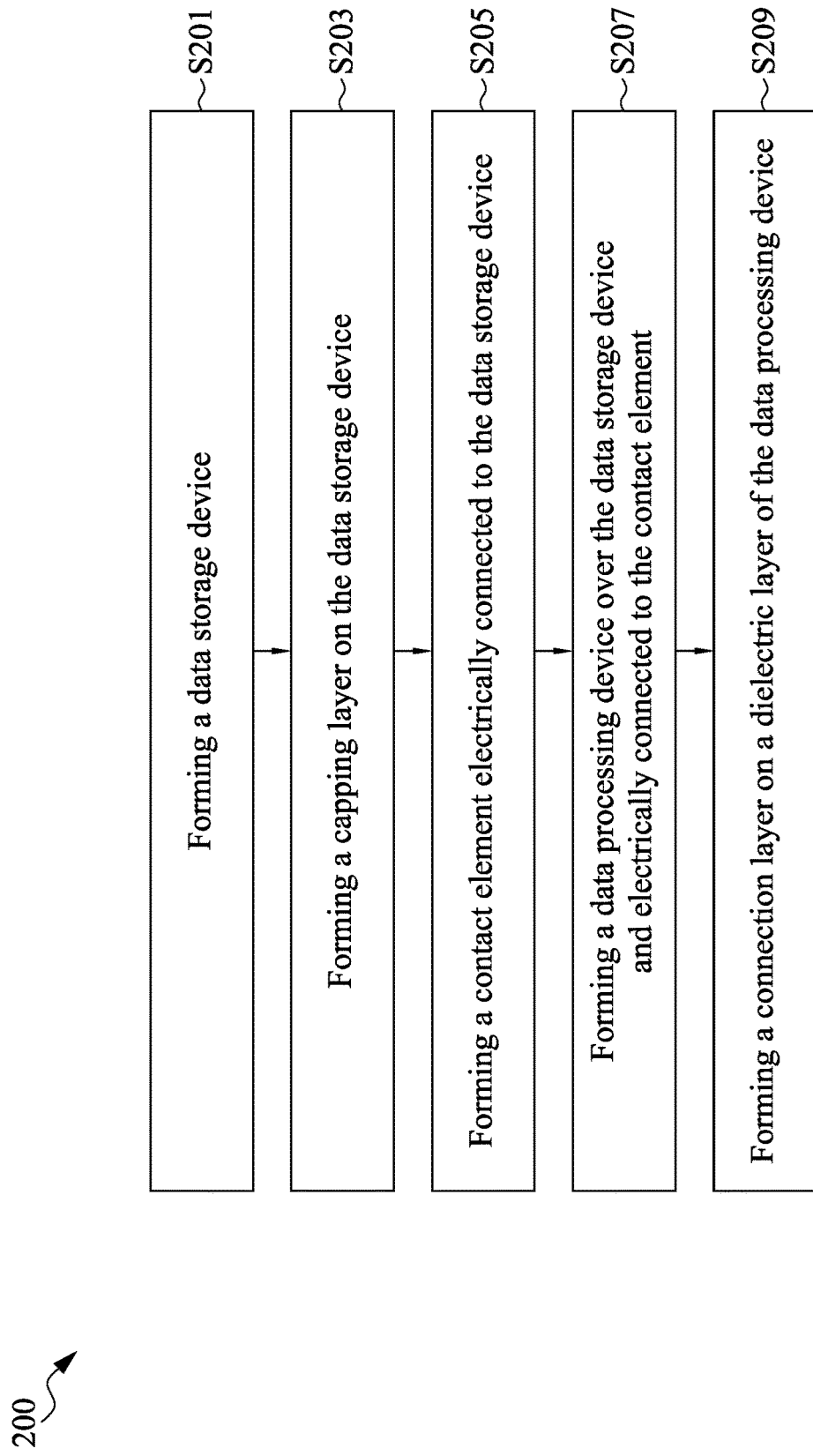
FIG. 18 is a flowchart of a method of manufacturing a memory, in accordance with some embodiments of the present disclosure.

FIG. 18 is a flowchart of a method 200 of manufacturing a memory, in accordance with some embodiments of the present disclosure.

The method 200 begins with operation S201 comprising forming a data storage device.

The method 200 continues with operation S203 comprising forming a capping layer on the data storage device.

The method 200 continues with operation S205 comprising forming a contact element. The contact element is electrically connected to the data storage device.

The method 200 continues with operation S207 comprising forming a data processing device over the data storage device. The data processing device is electrically connected to the contact element.

The method 200 continues with operation S209 comprising forming a connection layer on a dielectric layer of the data processing device.

The method 200 is merely an example, and is not intended to limit the present disclosure beyond what is explicitly recited in the claims. Additional operations can be provided before, during, or after each operations of the method 200, and some operations described can be replaced, eliminated, or moved around for additional embodiments of the method. In some embodiments, the method 200 can include further operations not depicted in FIG. 18. In some embodiments, the method 200 can include one or more operations depicted in FIG. 18.

One aspect of the present disclosure provides a memory, including: a data storage device, a data processing device, and a contact is element. The data processing device is disposed over the data storage device. The contact element is disposed between the data storage device and the data processing device. The contact element electrically connects the data storage device with the data processing device.

Another aspect of the present disclosure provides a method of manufacturing a memory, including: forming a data storage device; forming a contact element electrically connected to the data storage device; and forming a data processing device over the data storage device and electrically connected to the contact element.

The memory of the present disclosure includes the data storage device and the data processing device disposed on the data storage device and electrically connected to the data storage device through the contact element. The data processing device may receive or transmit commands, addresses, or data signals from an external circuit (e.g., a memory controller or a host device) prior to the signals being received by the data storage device. The data storage device may transmit data signals to the data processing device in response to the commands. The data processing device may be configured to process the data signals from the data storage device through, e.g., multiplexing or other functions, and provide higher processing bandwidth between the memory (or the data storage device) and the external device. As such, the bandwidth is increased without sacrificing the low-power performance.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A memory, comprising:
a data storage device;
a data processing device disposed over the data storage device, wherein the data processing device includes a dielectric layer and a transistor surrounded by the dielectric layer;
a capping layer disposed between a top surface of the data storage device and a bottom surface of the data processing device, wherein the dielectric layer is disposed on the capping layer;
a contact element disposed between the data storage device and the data processing device and electrically connecting the data storage device with the data processing device, wherein the contact element penetrates the dielectric layer of the data processing device and extends through the capping layer, wherein the transistor includes a first gate terminal and a second gate terminal disposed between the capping layer and the first gate terminal, wherein the second gate terminal is directly disposed on a top surface of the capping layer; and
a plurality of connection layers disposed on a top surface of the data processing device, wherein a first connection layer of the plurality of connection layers is electrically connected to the first gate terminal through a conductive via.

2. The memory of claim 1, wherein the data storage device comprises a capacitor electrically connected to the contact element.

3. The memory of claim 2, wherein the data processing device comprises a transistor electrically connected to the contact element.

4. The memory of claim 3, wherein the data storage device includes a bit line electrically connected to the transistor of the data processing device, and the transistor includes a first gate terminal electrically connected to the bit line of the data storage device.

5. The memory of claim 1, wherein the data storage device includes a bit line electrically connected to the contact element.

6. The memory of claim 1, wherein the contact element includes a first contact plug extending through the capping layer.

7. The memory of claim 6, wherein the contact element includes a second contact plug extending through the dielectric layer.

8. The memory of claim 6, wherein the capping layer includes silicon dioxide or sapphire.

9. The memory of claim 6, wherein the transistor includes an indium gallium zinc oxide (IGZO) channel disposed between the first gate terminal and the second gate terminal.

10. The memory of claim 1, wherein the contact element has a first projecting area on a surface of the data storage device, and the data processing device has a second projecting area on the surface of the data storage device, wherein the first projecting area and the second projecting area are non-overlapping.

11. The memory of claim 1, wherein the data processing device overlaps the data storage device in a vertical direction.

12. The memory of claim 1, wherein the contact element overlaps the data storage device in a vertical direction.

13. The memory of claim 1, wherein the data processing device includes one of a silicon-on-insulator (SOI) transistor, an IGZO-based transistor, a Ge-based transistor, or an N-type CMOS pseudo transistor.

14. The memory of claim 1, wherein the data storage device includes a stack of storage dies.

15. The memory of claim 1, wherein the size of the data storage device is greater than that of the data processing device.

16. The memory of claim 1, wherein the data processing device includes an electrostatic discharge (ESD) protection circuit.

17. The memory of claim 1, wherein the data processing device includes a programmable computing unit.

* * * * *